(12) United States Patent
Vogelsang et al.

(10) Patent No.: US 10,262,750 B2
(45) Date of Patent: *Apr. 16, 2019

(54) TESTING THROUGH-SILICON-VIAS

(71) Applicant: RAMBUS INC., Sunnyvalle, CA (US)

(72) Inventors: Thomas Vogelsang, Mountain View, CA (US); William Ng, San Francisco, CA (US); Frederick A. Ware, Los Altos Hills, CA (US)

(73) Assignee: RAMBUS INC., Sunnyvale, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 15/393,634

(22) Filed: Dec. 29, 2016

(65) Prior Publication Data

US 2017/0229190 A1 Aug. 10, 2017

Related U.S. Application Data

(63) Continuation of application No. 14/241,407, filed as application No. PCT/US2012/053516 on Aug. 31, 2012, now Pat. No. 9,570,196.

(Continued)

(51) Int. Cl.
*G01R 31/28* (2006.01)
*G11C 29/02* (2006.01)
(Continued)

(52) U.S. Cl.
CPC ........ *G11C 29/025* (2013.01); *G01R 31/2851* (2013.01); *G01R 31/2853* (2013.01);
(Continued)

(58) Field of Classification Search
None
See application file for complete search history.

(56) References Cited

U.S. PATENT DOCUMENTS 5,177,594 A 1/1993 Chance et al.
5,258,648 A 11/1993 Lin
(Continued)

FOREIGN PATENT DOCUMENTS

EP 0312217 4/1989
WO WO-2011-049710 4/2011
(Continued)

OTHER PUBLICATIONS

Huang, Yu-Jen et al., "A Built-In Self-Test Scheme for the Post-Bond Test of TSVs in 3D ICs", 2011 29th IEEE VLSI Test Symposium May 1-5, 2011, pp. 20-25. 6 pages.
(Continued)

*Primary Examiner* — Jermele M Hollington
(74) *Attorney, Agent, or Firm* — Womble Bond Dickinson (US) LLP; Daniel E. Ovanezian

(57) ABSTRACT

Embodiments generally relate to integrated circuit devices having through silicon vias (TSVs). In one embodiment, an integrated circuit (IC) device includes a field of TSVs and an address decoder that selectably couples at least one of the TSVs to at least one of a test input and a test evaluation circuit. In another embodiment, a method includes selecting one or more TSVs from a field of TSVs in at least one IC device, and coupling each selected TSV to at least one of a test input and a test evaluation circuit.

20 Claims, 9 Drawing Sheets

Related U.S. Application Data

(60) Provisional application No. 61/635,250, filed on Apr. 18, 2012, provisional application No. 61/529,982, filed on Sep. 1, 2011.

(51) Int. Cl.
   *H01L 21/66* (2006.01)
   *H01L 25/065* (2006.01)
   *G11C 8/10* (2006.01)
   *G11C 29/04* (2006.01)
   *G11C 5/02* (2006.01)
   *G11C 5/06* (2006.01)

(52) U.S. Cl.
   CPC .................. *G11C 5/02* (2013.01); *G11C 5/06* (2013.01); *G11C 8/10* (2013.01); *G11C 29/04* (2013.01); *H01L 22/34* (2013.01); *H01L 25/0657* (2013.01); *H01L 2224/16146* (2013.01); *H01L 2225/06513* (2013.01); *H01L 2225/06541* (2013.01); *H01L 2924/10253* (2013.01); *H01L 2924/1434* (2013.01)

(56) References Cited

U.S. PATENT DOCUMENTS

| | | |
|---|---|---|
| 5,327,013 A | 7/1994 | Moore et al. |
| 5,355,283 A | 10/1994 | Marrs et al. |
| 5,517,515 A | 5/1996 | Spell et al. |
| 5,703,400 A | 12/1997 | Wojnarowski et al. |
| 5,717,245 A | 2/1998 | Pedder |
| 5,770,477 A | 6/1998 | Brandenburg |
| 5,840,417 A | 11/1998 | Bolger |
| 5,854,534 A | 12/1998 | Beilin et al. |
| 6,022,758 A | 2/2000 | Badehi |
| 6,052,287 A | 4/2000 | Palmer et al. |
| 6,221,753 B1 | 4/2001 | Seyyedy |
| 6,643,434 B2 | 11/2003 | Cayrefourcq et al. |
| 7,745,920 B2 | 6/2010 | Lee et al. |
| 8,982,598 B2 | 3/2015 | Franzon et al. |
| 9,570,196 B2 * | 2/2017 | Vogelsang ........... G11C 29/025 |
| 2004/0257847 A1 | 12/2004 | Matsui et al. |
| 2011/0080185 A1 | 4/2011 | Wu et al. |
| 2011/0084722 A1 | 4/2011 | Nishioka |
| 2011/0093224 A1 | 4/2011 | Ide et al. |
| 2011/0102006 A1 | 5/2011 | Choi et al. |
| 2011/0102011 A1 | 5/2011 | Van der Plas et al. |
| 2011/0125982 A1 | 5/2011 | Choi et al. |
| 2011/0175639 A1 | 7/2011 | Yoko et al. |
| 2011/0184688 A1 | 7/2011 | Uetake et al. |
| 2012/0092943 A1 | 4/2012 | Nishioka |
| 2013/0227344 A1 | 8/2013 | Sohn et al. |
| 2014/0269109 A1 | 9/2014 | Kong |

FOREIGN PATENT DOCUMENTS

| | | |
|---|---|---|
| WO | WO-2011-115648 | 9/2011 |
| WO | WO-2013/033628 A1 | 3/2013 |

OTHER PUBLICATIONS

International Search Report and Written Opinion dated Nov. 9, 2012 in International Application No. PCT/US2012/053516. 10 pages.

JEDEC Publication dated Nov. 2009, "3D Chip Stack with Through-Silicon Vias (TSVS): Identifying, Evaluating and Understanding Reliability Interactions", JEDEC Publication No. 158, JEDEC Solid State Technology Association. 24 Pages.

Kang et al., "8Gb 3D DDR3 DRAM Using Through-Silicon-Via Technology," ISSCC 2009, Session7, 2009 IEEE International Solid-State Circuits Conference, pp. 130-132, Feb. 10, 2009. 3 pages.

PCT International Preliminary Report on Patentability dated Mar. 13, 2014 (Chapter 1) in International Application No. PCT/US2012/053516. 8 pages.

\* cited by examiner

TESTING THROUGH-SILICON-VIAS

This application is a continuation of U.S. patent application Ser. No. 14/241,407, filed Feb. 26, 2014, which claims priority to PCT National Stage Application No. PCT/US12/53516, filed Aug. 31, 2012, which claims priority to U.S. Provisional Patent Application No. 61/635,250, filed Apr. 18, 2012, and U.S. Provisional Patent Application No. 61/529,982, filed Sep. 1, 2011, the contents of each of which are hereby incorporated by reference herein in their entirety.

BACKGROUND

A through-silicon-via (TSV) is a conductive via that provides electrical continuity through a silicon wafer or die. TSVs enable two or more integrated circuit (IC) devices to be stacked vertically into a three-dimensional (3D) chip stack. For example, the TSVs of an IC device at the top of a stack connect to the TSVs of an IC device below in the stack. By electrically connecting the IC devices in a stack, the TSVs enable the IC devices in the stack to function as a single device. TSV technology enables a 3D chip stack to have increased connectivity, bandwidth, and functionality, yet occupy a small footprint area.

BRIEF DESCRIPTION OF THE DRAWINGS

The various embodiments disclosed herein are illustrated by way of example and not by way of limitation in the figures of the accompanying drawings, in which like reference numerals refer to similar elements.

DETAILED DESCRIPTION

In various embodiments disclosed herein, a test circuit enables integrated circuit device (IC) tests to be performed on one or more TSVs in a field of TSVs of the integrated circuit device, where each TSV is individually addressable for testing. The test circuit includes an address decoder that selectably couples one or more TSVs to a test input and/or test evaluation circuit, all of which may be integrated into the IC device, such as a memory device. Embodiments enable testing that extends beyond TSVs of a single IC device. For example, embodiments may also test one or more chains of TSVs in a stack of IC devices, such as a memory stack. The test circuit may share resources (e.g., address decoder, external test equipment, test flows, etc.) with resources used for other tests (e.g., testing of memory arrays). Accordingly, embodiments disclosed herein provide accurate and efficient testing of TSVs with little overhead.

Figure 1:
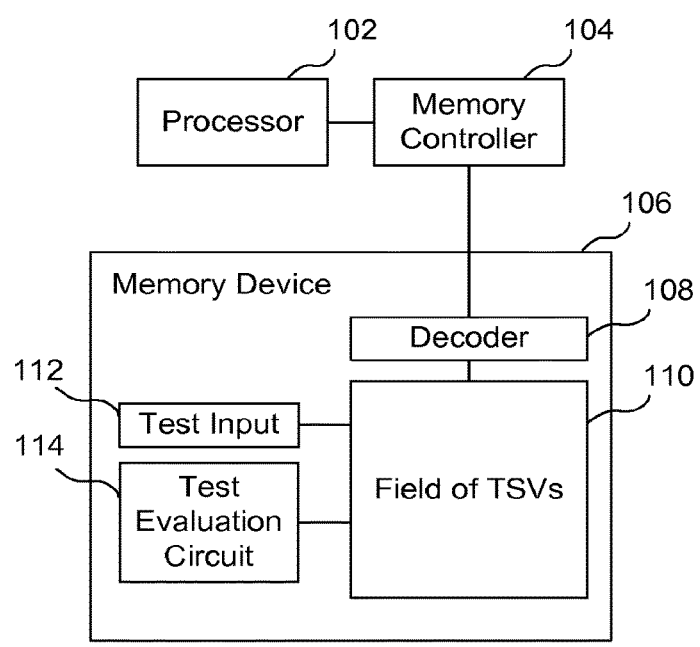
FIG. 1 illustrates a block diagram of an example environment, which may be used to implement the embodiments described herein.

FIG. 1 illustrates a block diagram of an example environment 100, which may be used to implement the embodiments described herein. As shown, a processor 102 is coupled to a memory controller 104, which is coupled to a memory device 106. Memory device 106 includes an address decoder 108, a field of TSVs 110, a test input 112, and a test evaluation circuit 114. As described in more detail below, in one embodiment, address decoder 108 selectably couples one or more of the TSVs to test input 112 and/or test evaluation circuit 114 for testing. In various embodiments, a field of TSVs may include up to thousands of TSVs. In some embodiments, environment 100 may not have all of the elements listed and/or may have other elements instead of, or in addition to, those listed above. For example, FIG. 2 shows a more detailed embodiment, which may be used to implement embodiments described herein.

Figure 2:
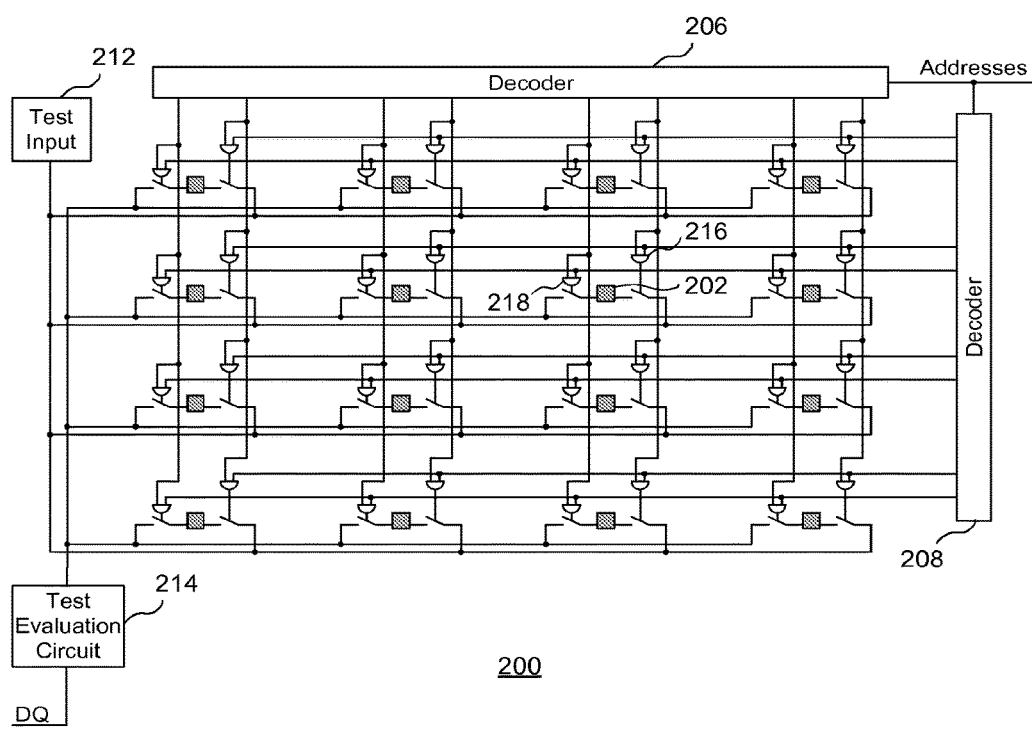
FIG. 2 illustrates a schematic diagram of an example test circuit, which may be used to implement the embodiments described herein.

FIG. 2 illustrates a schematic diagram of an example test circuit 200, according to one embodiment. FIG. 2 shows a field of TSVs (an example TSV 202 is numbered), a column address decoder 206, a row address decoder 208, a test input 212, and a test evaluation circuit 214. In one embodiment, test circuit 200 may include column address decoder 206, row address decoder 208, test input 212, test evaluation circuit 214, and conductive lines and switches (example switches 216 and 218 are numbered), independent of any other test circuitry. The conductive lines and switches are operable to address each of the TSVs, and operable to couple each of the TSVs to test input 212 and to test evaluation circuit 214. The switches may be implemented with any suitable logic gates (e.g., AND gates, NAND gates, etc.) or combination thereof. In example embodiments described herein, test circuit 200 is integrated into an IC device, which for example, may be any type of volatile or non-volatile IC memory device. For example, test circuit 200 may be integrated into a memory device such as a dynamic random-access memory (DRAM) device, or a controller device.

In one embodiment, test input 212 may be coupled to external test equipment, which may provide a test stimulus (e.g., a charge, an alternating current (A/C), a pulsed bias, test data, or other information, etc.) to test input 212; and test evaluation circuit 214 may also be coupled to external test equipment, which may receive the test stimulus from test evaluation circuit 214. The external test equipment coupled to test input 212 and test evaluation circuit 214 may be the same test equipment unit or may be different test equipment units.

In one embodiment, column address decoder 206 and row address decoder 208 may be shared resources within an IC device. For example, column address decoder 206 and row address decoder 208 may also be used to address memory cells in a memory device. This contributes to reduction in overhead (e.g., die space, etc.). In an alternative embodiment, column address decoder 206 and row address decoder 208 may be dedicated to addressing TSVs in a field of TSVs of an IC device. In yet another alternative embodiment, the decoders for some of the bits (e.g., the most significant bits)

may be shared while the decoder for the remaining bits (e.g., the least significant bits) may be dedicated to the TSV field. Operation of test circuit 200 is described in more detail below in connection with FIGS. 3 and 4.

Figure 3:
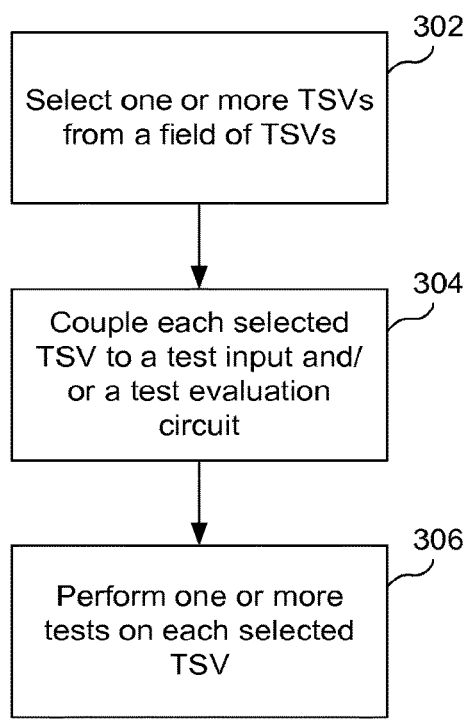
FIG. 3 illustrates an example simplified flow diagram for testing TSVs, according to one embodiment.
Figure 4:
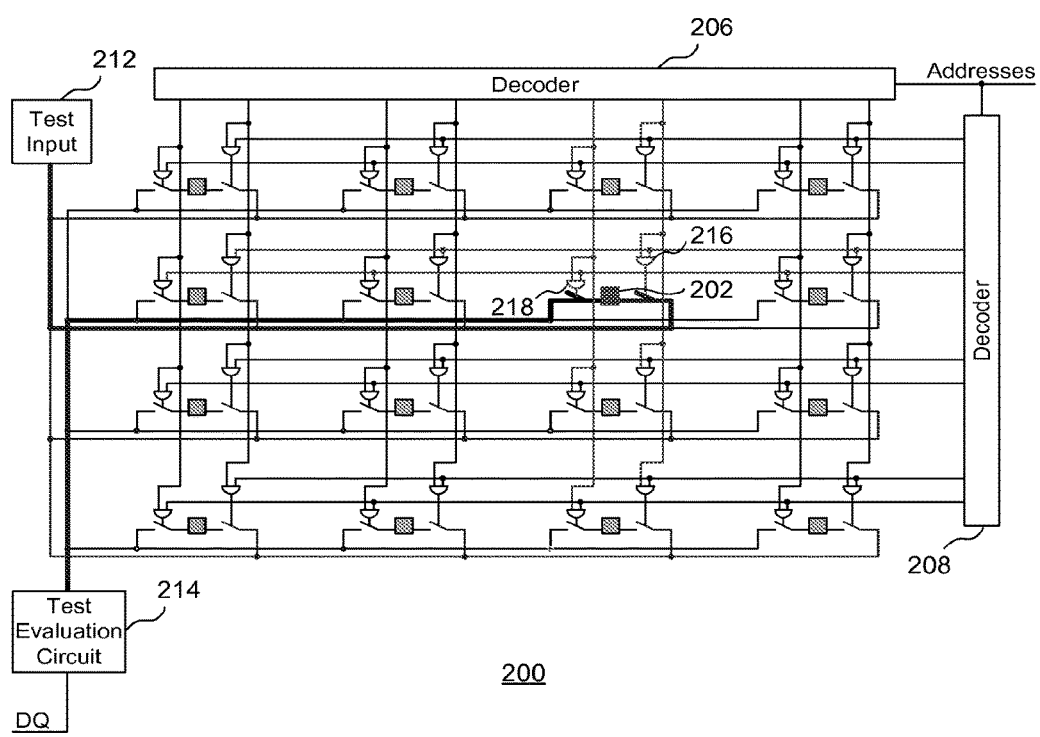
FIG. 4 illustrates a schematic diagram of the example test circuit of FIG. 2, where a TSV is coupled to a test input and a test evaluation circuit, according to one embodiment.

FIG. 3 illustrates an example simplified flow diagram for testing TSVs, according to one embodiment. FIG. 4 illustrates a schematic diagram of the example test circuit 200 of FIG. 2, where TSV 202 is coupled to test input 212 and test evaluation circuit 214, according to one embodiment. Referring to both FIGS. 3 and 4, a process for testing TSVs is initiated in block 302, where a test application selects one or more TSVs (e.g., TSV 202) from a field of TSVs.

In one embodiment, the selection may be part of a testing algorithm that selects one or more TSVs for testing. For ease of illustration, one selected TSV 202 from a field of TSVs in one IC is shown. In other embodiments, multiple TSVs from the field of TSVs may be selected for testing. In one embodiment, the address used for the selection may be an address used in an extended address mode for redundancy testing, or may be an address used in any another suitable extended address mode.

In block 304, the test application couples each selected TSV to test input 212 and/or test evaluation circuit 214. As shown in FIG. 4, for example, column address decoder 206 and row address decoder 208 couple TSV 202 to test input 212 and test evaluation circuit 214 utilizing switches 216 and 218. These connections are highlighted with bold lines. As FIG. 4 shows, column address decoder 206 and row address decoder 208 couple TSV 202 to test input 212 and test evaluation circuit 214 by closing switches 216 and 218.

In block 306, the test application performs one or more tests on each selected TSV. In one embodiment, the one or more tests may be a part of any testing algorithm for testing TSVs. Such tests may be performed on the selected TSVs in serial or in parallel, depending on the specific implementation. As indicated above, test input 212 may couple to external test equipment, which may provide a test stimulus (e.g., a charge, an alternating current (A/C), a pulsed bias, capacitance, test data, or other information, etc.). In various embodiments, test input 212 receives the test stimulus; and test evaluation circuit 214 receives test stimulus via each selected TSV, after which any suitable test equipment evaluates the received test stimulus to determine the quality of each selected TSV. In one embodiment, if a given TSV is deemed to be substandard during the testing (e.g., TSV is non-functional, TSV has excessive leakage, etc.), the test application or other application may repair the IC device by programming around the substandard TSV, if possible. Such repairs are possible when the field of TSVs includes redundant TSVs, and the substandard TSVs are indeed redundant.

In the embodiments described herein, TSVs are addressed by address decoders similar to the manner in which memory cells are addressed in a memory device. As such, column address decoder 206 and row address decoder 208 may also be used to address memory cells in a memory device. Also, test flows of memory devices such as DRAM devices may also be used to test TSVs in the embodiments described herein. Because DRAM test flows are optimized for array testing, addressing a TSV field as an array enables efficient TSV testing with little overhead per TSV.

The test application may perform a variety of tests on the selected TSVs to test the quality of the selected TSVs (e.g., tests to determine shorts or opens, leakage tests based on capacitance, tests using pulsed-signal propagation, data compression tests, differential comparisons among two or more test results, etc.). In one embodiment, these tests may be performed on the die before assembly. In one embodiment, TSV testing may occur when other pre-assembly tests of the IC device are performed (e.g., during the testing of memory cells of a memory device).

In the embodiments described herein, because there is one test evaluation circuit per die, the test evaluation circuit may be large and complex, allowing for more sophisticated testing. Also, multiple connections may be activated simultaneously when a multi-bit data path is implemented instead of a one-bit path, thereby allowing parallel testing to be more compatible with other functional tests on the IC device.

In one embodiment, the test application may be executed by any suitable processor such as processor 102 of FIG. 1, and the test application provides instructions that enable the processor to perform the functions described herein. Also, the test application may be stored on any suitable storage location or computer-readable storage medium (e.g., any storage associated with an IC device test system, analyzer, etc.).

Figure 5:
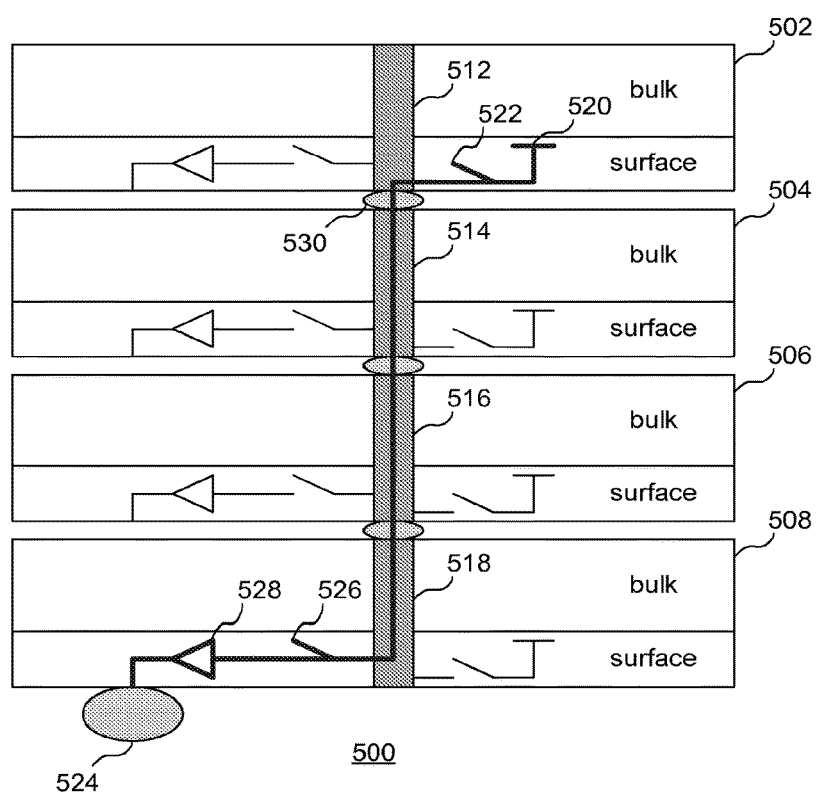
FIG. 5 illustrates a cross-section view of a stack of IC devices coupled by a chain of TSVs, where the TSVs are coupled to a test node, according to one embodiment.

FIG. 5 illustrates a cross-section view of a stack 500 of IC devices 502, 504, 506, and 508 coupled by a chain of TSVs 512, 514, 516, and 518, where the chain of TSVs 512-518 is coupled to an input node 520 via a switch 522, to a test node 524 via a switch 526 and an output driver 528, according to one embodiment. As FIG. 5 shows, the chain of TSVs may be a vertical series of TSVs spanning multiple IC devices. In one embodiment, a TSV travels from the top side to the bottom side of the silicon die. In one embodiment, interposers or solder balls (an example solder ball 530 is numbered) may be coupled between TSVs in the TSV chain. In one embodiment, test node 520 may be coupled to a test evaluation circuit. While 4 IC devices are for shown for the purposes of illustration, in other embodiments there may be fewer IC devices (e.g., 2 or 3 IC devices) or more IC devices (e.g., 5 or more IC devices).

In one embodiment, devices 502-508 may be any one or more types of IC devices, and may be homogeneous or heterogeneous devices. Also, devices 502-508 may be any type of volatile or non-volatile IC device. For example, devices 502-508 may be memory devices such as DRAM devices.

Figure 6:
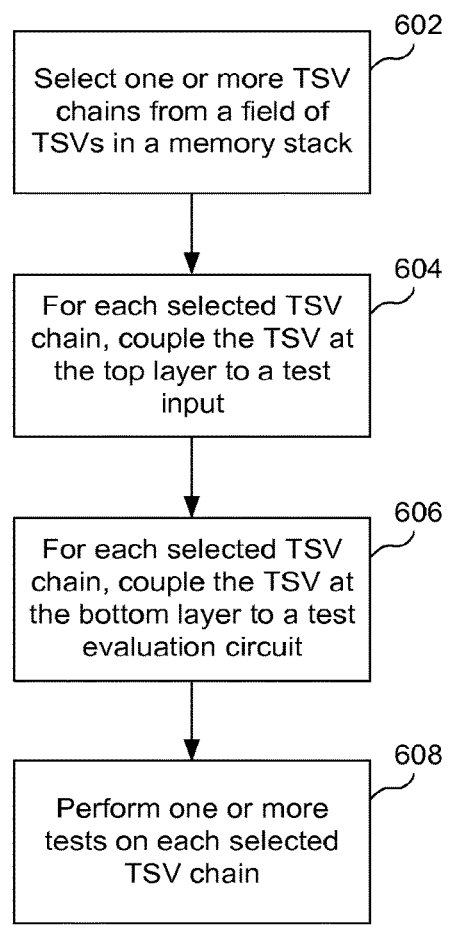
FIG. 6 illustrates an example simplified flow diagram for testing TSV chains, according to one embodiment.

FIG. 6 illustrates an example simplified flow diagram for testing TSV, according to one embodiment. Referring to both FIGS. 5 and 6, a process for testing TSV chains is initiated in block 602, where a test application selects one or more TSV chains from a field of TSVs in a memory stack, such as the chain of TSVs 512-518. In the embodiments described herein, a field of TSVs may include a single two-dimensional (2D) array of TSVs in a single IC device (as in the example above), or may include multiple arrays of TSVs in a 3D stack of IC devices (as in this example).

Figure 7:
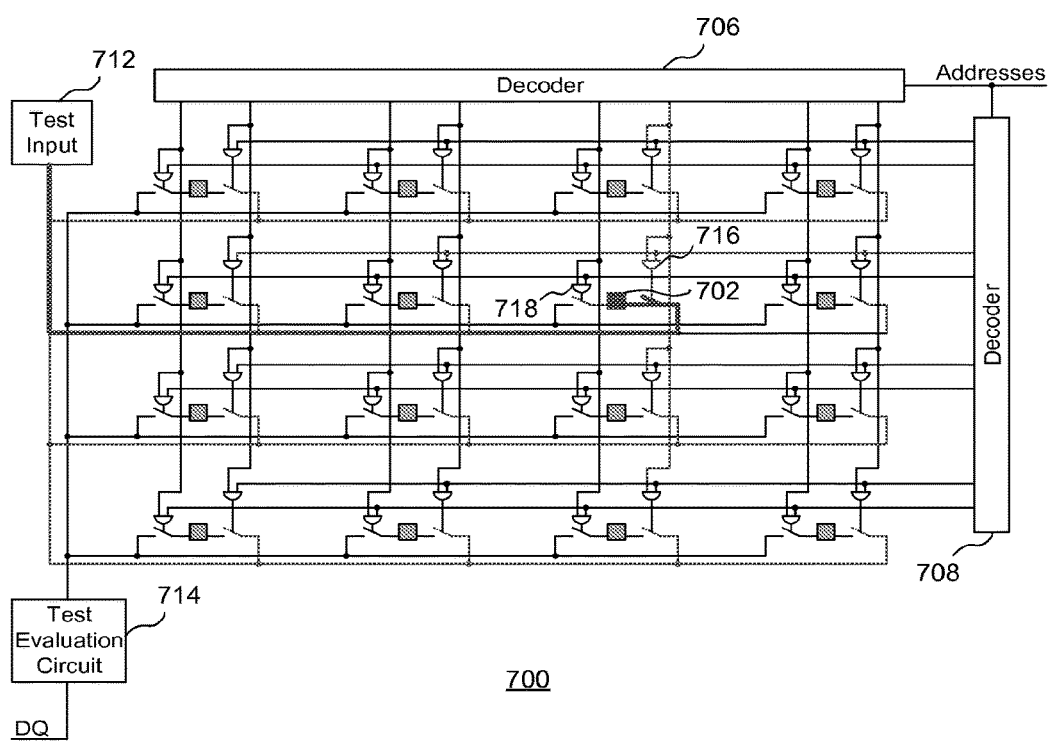
FIG. 7 illustrates a schematic diagram of an example test circuit, where a TSV of a top-layer IC device in the stack of FIG. 5 is coupled to a test input, according to one embodiment.

Referring now to FIGS. 6 and 7, in block 604, for each selected TSV chain, the test application couples the TSV at the top layer to a test input. FIG. 7 illustrates a schematic diagram of an example test circuit 700, where a TSV of a top-layer IC device in stack 500 of FIG. 5 is coupled to a test input, according to one embodiment.

FIG. 7 shows a field of TSVs (an example TSV 702 is numbered), a column address decoder 706, a row address decoder 708, a test input 712, a test evaluation circuit 714, and conductive lines and switches (example switches 716 and 718 are numbered). The conductive lines and switches are operable to address each of the TSVs, and operable to couple each of the TSVs to test input 712 and to test evaluation circuit 714. As FIG. 7 shows, column address decoder 706 and row address decoder 708 couple TSV 702 to test input 712 by closing switch 716. This connection is highlighted with bold lines.

In one embodiment, test input 712 may be coupled to external test equipment, which may provide a test stimulus (e.g., a charge, an alternating current (A/C), a pulsed bias, capacitance, test data, or other information, etc.) to test input 712. In this example, TSV 702 at the top of the TSV chain passes the test stimulus from test input 712 to the TSV in the layer below (e.g., TSV 802 shown in FIG. 8).

Figure 8:
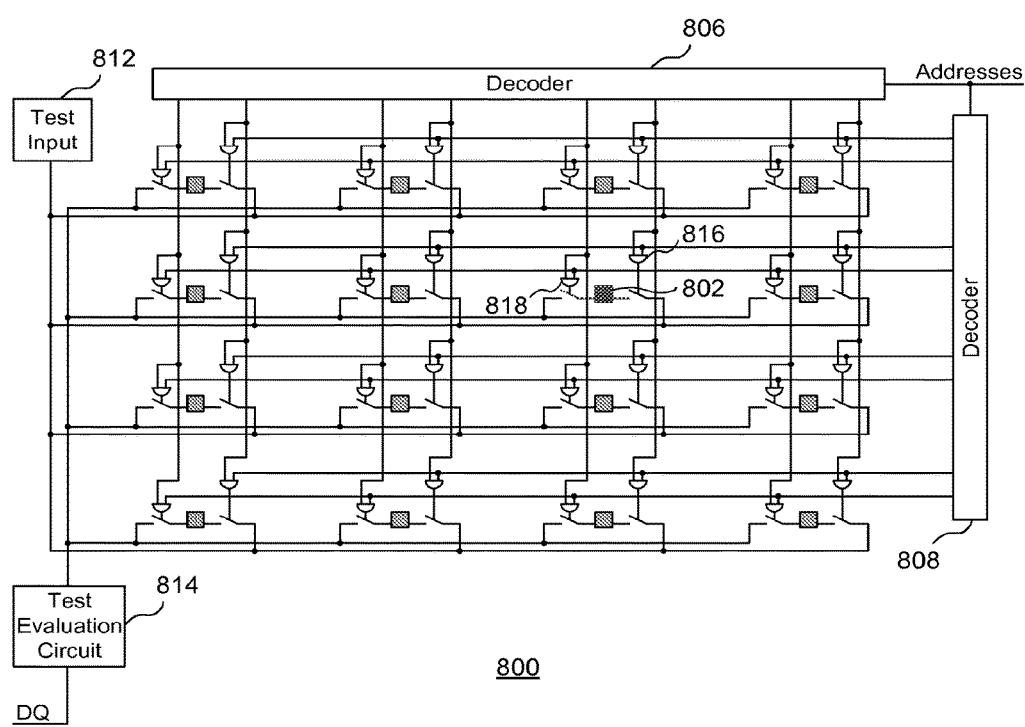
FIG. 8 illustrates a schematic diagram of an example test circuit, where a TSV of a middle-layer IC device in the stack of FIG. 5 is not coupled to a test input or test evaluation circuit, according to one embodiment.

FIG. 8 illustrates a schematic diagram of an example test circuit 800, where a TSV of a middle-layer IC device in stack 500 of FIG. 5 is not coupled to a test input or test evaluation circuit, according to one embodiment. Test circuit 800 may represent a test circuit of any middle-layer IC device in a stack (e.g., IC devices 504 and 506).

FIG. 8 shows a field of TSVs (an example TSV 802 is numbered), a column address decoder 806, a row address decoder 808, a test input 812, a test evaluation circuit 814, and conductive lines and switches (example switches 816 and 818 are numbered). The conductive lines and switches are operable to address each of the TSVs, and operable to couple each of the TSVs to test input 812 and to test evaluation circuit 814. As FIG. 8 shows, however, column address decoder 206 and row address decoder 208 do not close switches 816 and 818 (or any other switches). As such, TSV 802 and the other TSVs are not coupled to test input 212 or to test evaluation circuit 214.

As FIG. 8 shows, all of the switches, including switches 816 and 818, are open. As a result, because TSV 802 is in the middle of the TSV chain, TSV 802 simply passes the test stimulus from the TSV in the layer above (e.g., TSV 702) to the TSV in the layer below (e.g., another middle-layer TSV in the chain, ultimately to TSV 902 shown in FIG. 9, etc.).

Figure 9:
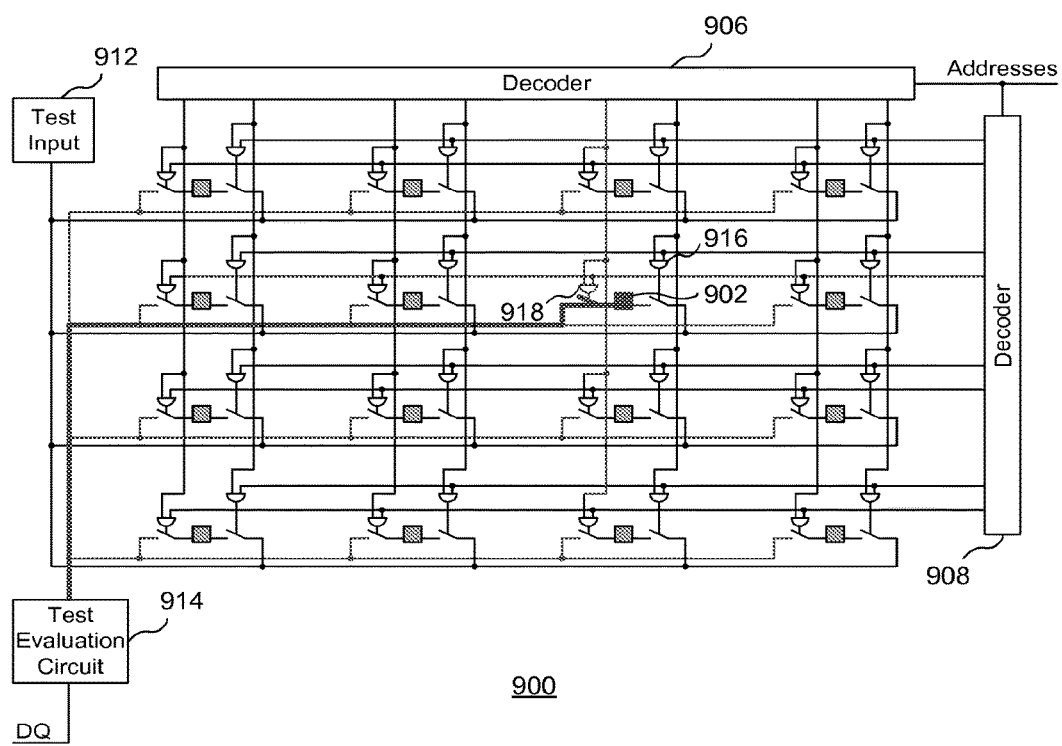
FIG. 9 illustrates a schematic diagram of an example test circuit, where a TSV of a bottom-layer IC device in the stack of FIG. 5 is coupled to a test evaluation circuit, according to one embodiment.

Referring now to FIGS. 6 and 9, in block 606, for each selected TSV chains, the test application couples the TSV at the bottom layer to a test evaluation circuit. FIG. 9 illustrates a schematic diagram of an example test circuit 900, where a TSV of a bottom-layer IC device in stack 500 of FIG. 5 is coupled to a test evaluation circuit, according to one embodiment. FIG. 9 shows a field of TSVs (an example TSV 902 is numbered), a column address decoder 906, a row address decoder 908, a test input 912, a test evaluation circuit 914, and conductive lines and switches (example switches 916 and 918 are numbered). The conductive lines and switches are operable to address each of the TSVs, and operable to couple each of the TSVs to test input 912 and to test evaluation circuit 914. As FIG. 9 shows, column address decoder 906 and row address decoder 908 couple TSV 902 to test evaluation circuit 214 by closing switch 918. This connection is highlighted with bold lines.

In one embodiment, the TSV (e.g., TSV 902) at the bottom of the TSV chain passes the test stimulus from the TSV in the layer above (e.g., TSV 802) to test evaluation circuit 914. In one embodiment, test evaluation circuit 914 may be coupled to external test equipment (e.g., via a physical layer (PHY)), which may receive the test stimulus from test evaluation circuit 914. The external test equipment coupled to test evaluation circuit 914 may be the same unit or a different unit from the test equipment coupled to test input 712.

Referring still to FIG. 6, in block 608, the test application performs one or more tests on each selected TSV chain. The test application may perform a variety of tests on the selected TSV chains to test the quality of the selected TSV chains (e.g., tests to determine shorts or opens, leakage test based on capacitance, tests using pulsed-signal propagation, data compression tests, differential comparisons among two or more test results, etc.). In one embodiment, these tests are performed on the stack of IC devices after assembly. In one embodiment, the testing of TSV chains may occur when other post-assembly tests of the IC device are performed (e.g., during testing of memory cells of a memory device). In various embodiments, test input 712 receives the test stimulus; and test evaluation circuit 914 receives the test stimulus via each selected TSV chain, after which any suitable test equipment evaluates the received test stimulus to determine the quality of each selected TSV chain. In one embodiment, if a given TSV chain is deemed to be substandard during the testing (e.g., fails a continuity test, fails a leakage test, etc.), the test application or other application may repair the IC device stack by programming around the substandard TSV chain, if possible. Such repairs are possible when the field of TSVs includes redundant TSV chains, and the substandard TSV chains are indeed redundant.

For ease of illustration, some example embodiments disclosed herein are described in the context of a top-layer TSV of a TSV chain, where the top-layer TSV is coupled to a test input, and a bottom-layer TSV of the TSV chain, where the bottom-layer TSV is coupled to a test evaluation circuit. Some embodiments disclosed herein may apply other testing configurations. For example, in some embodiments, address decoders may couple a bottom-layer TSV of a TSV chain to a test input and couple a top-layer TSV of the TSV chain to a test evaluation circuit. In some embodiments, the test application may select different TSV chains of different lengths (e.g., different numbers of TSVs in a chain). For example, in some embodiments, in a given TSV chain, the particular TSV that is coupled to a test input, and the particular TSV that is coupled to a test evaluation circuit may vary, depending on the specific implementation. For example, in one embodiment, address decoders may couple a middle-layer TSV in a TSV chain to a test input, and couple either a higher-level TSV and/or a lower-level TSV to a test evaluation circuit. In an alternative embodiment, address decoders may couple a middle-layer TSV in a TSV chain to a test evaluation circuit, and couple either a higher-level TSV and/or a lower-level TSV to a test input.

In the embodiments described herein, test circuits 700, 800, and 900 may include: respective column address decoders 706, 806, and 906; row address decoders 708, 808, and 908; test inputs 712, 812, and 912; test evaluation circuits 714, 814, and 914; and address lines and switches operable to couple each of the TSVs to appropriate test inputs and test evaluation circuits.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and very-high-speed IC hardware description language (VHDL), formats supporting register level description languages like register transfer language (RTL), and formats supporting geometry description languages such as graphic database system II stream format (GDSII), GDSIII, GDSIV, Caltech intermediate form (CIF), manufacturing electron-beam exposure system (MEBES) and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. An address or other value provided "in" or "with" a command may be transmitted concurrently (i.e., at least partly overlapping in time) with a group of bits containing a command code or identifier, or prepended, appended or otherwise transmitted in association with the command code or identifier. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit (IC) device stack comprising:
a plurality of IC devices comprising a field of through silicon vias (TSVs); and
an address decoder configured to couple a selected TSV to a test input or a test evaluation circuit.

2. The IC device stack of claim 1, wherein the selected TSV is a top-layer TSV or a bottom-layer TSV in a selected TSV chain, and wherein the address decoder is to couple the selected TSV to the test input.

3. The IC device stack of claim 1, wherein the selected TSV is a top-layer TSV or a bottom-layer TSV in a selected TSV chain, and wherein the address decoder is to couple the selected TSV to the test evaluation circuit.

4. The IC device stack of claim 1, wherein the selected TSV is a middle-layer TSV in a selected TSV chain, and wherein the address decoder is to couple the selected TSV to at least one of the test input or the test evaluation circuit.

5. The IC device stack of claim 1, further comprising switches, wherein to couple the selected TSV to the test input or the test evaluation circuit, the address decoder is to couple a top-layer TSV of a selected TSV chain to the test input using the switches.

6. The IC device stack of claim 1, further comprising switches, wherein to couple the selected TSV to the test input or the test evaluation circuit, the address decoders are to couple a bottom-layer TSV of a selected TSV chain to the test evaluation circuit.

7. The IC device stack of claim 1, wherein the address decoder comprises a column address decoder and a row address decoder.

8. The IC device stack of claim 1, wherein the IC stack is a stack of memory devices and the address decoder is further to address memory cells in the stack of memory devices.

9. The IC device stack of claim 1, wherein the test input is operatively coupled to external equipment that provides a test stimulus to the test input, and wherein the test evaluation circuit is operatively coupled to external equipment that receives the test stimulus from the test evaluation circuit.

10. An integrated circuit (IC) memory device comprising:
a field of through silicon vias (TSVs); and
an address decoder operatively coupled to the field of TSVs, the address decoder to:
address a memory cell in the IC memory device; and
couple a selected TSV in the field of TSVs to a test input or a test evaluation circuit.

11. The IC memory device of claim 10, further comprising switches, wherein the address decoder is to selectably couple the TSVs to at least one of the test input or the test evaluation circuit using the switches.

12. The IC memory device of claim 11, wherein the switches comprise logic gates.

13. The IC memory device of claim 10, wherein the address decoder comprises a column address decoder and a row address decoder.

14. The IC memory device of claim 10, wherein the test input is operatively coupled to external equipment that provides a test stimulus to the test input, and wherein the test evaluation circuit is operatively coupled to external equipment that receives the test stimulus from the test evaluation circuit.

15. A method comprising:
selecting a through silicon vias (TSVs) from a field of TSVs in an integrated circuit (IC) device; and
coupling, by an address decoder, the selected TSV to at least one of a test input or a test evaluation circuit.

16. The method of claim 15, further comprising testing the selected TSV using the test input and the test evaluation circuit.

17. The method of claim 15, further comprising testing the selected TSV using the test input and the test evaluation circuit, wherein the testing comprises:
   providing a test stimulus to the test input;
   receiving the test stimulus from the test evaluation circuit; and evaluating the test stimulus.

18. The method of claim 15, wherein the selecting comprises addressing the one or more TSVs with the address decoder.

19. The method of claim 15, wherein the at least one IC device is a memory device the address decoder is further to address memory cells in the memory device.

20. The method of claim 15, wherein the at least one IC device is a memory device, and wherein the address decoder also addresses memory cells.

* * * * *